United States Patent
Salmia et al.

(10) Patent No.: US 10,084,439 B2
(45) Date of Patent: Sep. 25, 2018

(54) DRIVER CIRCUIT

(71) Applicant: ABB Technology Oy, Helsinki (FI)

(72) Inventors: Teemu Salmia, Espoo (FI); Jukka-Pekka Kittilä, Helsinki (FI); Tero Herrala, Helsinki (FI); Mikko Taulanne, Helsinki (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/375,964

(22) Filed: Dec. 12, 2016

(65) Prior Publication Data

US 2017/0170817 A1    Jun. 15, 2017

(30) Foreign Application Priority Data

Dec. 11, 2015    (EP) ..................... 15199554

(51) Int. Cl.
   *H03B 1/00*    (2006.01)
   *H03K 17/04*   (2006.01)
   *H03K 17/06*   (2006.01)
   *H03K 17/14*   (2006.01)

(52) U.S. Cl.
   CPC ......... *H03K 17/0406* (2013.01); *H03K 17/06* (2013.01); *H03K 17/14* (2013.01)

(58) Field of Classification Search
   CPC ................................. H03K 17/0406
   See application file for complete search history.

(56) References Cited

U.S. PATENT DOCUMENTS

2006/0244479 A1*  11/2006  Major ................. H03K 17/163
                                                            326/29
2011/0133790 A1    6/2011  Nagata et al.
2015/0318850 A1   11/2015  Hiyama
2015/0326009 A1   11/2015  Mari Curbelo et al.

FOREIGN PATENT DOCUMENTS

EP        2178211 B1        3/2011

OTHER PUBLICATIONS

European Search Report, EP15199554, dated May 18, 2016, ABB Technology Oy, 6 pages.

* cited by examiner

*Primary Examiner* — Daniel Puentes
(74) *Attorney, Agent, or Firm* — J. Bruce Schelkopf; Taft Stettinius & Hollister LLP

(57) ABSTRACT

A gate driver circuit and a method of operating a gate driver circuit. The gate driver circuit comprising a high auxiliary voltage rail and a low auxiliary voltage rail for receiving high auxiliary voltage and low auxiliary voltage, output stage connected to the auxiliary voltage rails and comprising a control input and an output terminal for providing an output voltage of the gate driver, plurality of series connections of controllable switches and resistive components, wherein a first part of the plurality of series connections is connected between the high auxiliary voltage rail and control input of the output stage, and a second part of the plurality of series connections is connected between the low auxiliary voltage rail and control input of the output stage, and a control circuit for controlling the controllable switches for providing a control voltage and a control current to the control input of the output stage.

17 Claims, 4 Drawing Sheets

DRIVER CIRCUIT

FIELD OF THE INVENTION

The present invention relates to driver circuits, and particularly to a driver circuit for a power semiconductor component.

BACKGROUND OF THE INVENTION

Power semiconductor components, such as IGBTs, are used for switching high currents and high voltages in variety of devices. Such devices include power converters that are used for converting electrical power from one form to another. Power converters comprise one or more power semiconductor components that are employed as switches.

When a power semiconductor component is used as a switch, the component operates between a fully conducting state and a blocking state. In the conducting state the switch component provides a low impedance current path and in the blocking state the switch component blocks the current and holds the voltage over the component.

A driver circuit is employed for controlling a power semiconductor component in a desired manner. For an IGBT component, a driver circuit produces a gate voltage to the gate of the IGBT. A positive voltage with reference to the emitter of the component is provided to turn the component on. The turn-off of an IGBT component is obtained when the gate is drawn to a negative potential with respect to the emitter. Thus for controlling the power semiconductor component, a driver circuit is used, which is able to produce suitable voltages to the emitter of the component.

In a simple form of gate driver, the gate driver produces a positive voltage to the gate when the gate driver receives a gate control signal to turn-on the component. Correspondingly, when a gate control signal to turn-off the component is received, the driver circuit produces a suitable lower voltage to the gate of the controlled component. The gate control signal may be a logic level signal having high and low states, and the states are interpreted as turn-on and turn-off commands of the controlled component.

For producing the required positive and negative voltages for controlling the power semiconductor component according to the gate control signal, the gate drivers receive a high auxiliary voltage and a low auxiliary voltage, which may be positive auxiliary voltage and a negative auxiliary voltage. These voltages are led to the gate of the controlled component using a pair of switches in the driver circuit. The pair of switches is typically connected in series across the positive and the negative auxiliary voltage, and upper switch is controlled conductive for turning-on the controlled component while the lower switch is controlled conductive for turning the component off.

It is further known that a gate resistance is connected in the output of a driver circuit. The gate resistance limits the current from the output switches of the driver circuit and thereby affects the speed of the state change of the controlled power semiconductor component. Different gate resistors may be employed for turn-on and for turn-off so as to change the properties of turn-on and turn-off independently from each other. The use of two gate resistors also enables to use a soft turn-off procedure, in which the resistors are connected in series using the output switches for a short period of time to produce a lowered gate voltage. The soft turn-off procedure is used in connection with over currents through the controlled component such that the high current is not shut-down too quickly.

One of the problems associated with the known gate drivers is that they are not able to drive the controlled power semiconductor component, such as an IGBT, in an efficient and controlled manner in which the different periods of turn-on and turn-off processes can be taken into account. Further, the known gate drivers do not enable to control the on-state gate voltage or to select different turn-on or turn-off speeds during the operation of the device, as these speeds are governed by the gate resistors.

Document EP 2178211 B1 shows a gate driver arrangement, in which gate voltage from the gate driver is in a form of a pulse width modulated (PWM) signal. In this arrangement, a PWM signal is amplified by output switches of the gate driver. The pulse ratio of the PWM signal is varied based on stored reference values on the basis of measured current. Although this arrangement increases the versatility of control of the switching periods, the arrangement is complicated and requires fast components. Further, in the arrangement, the average gate voltage level may be set using selected PWM patterns. However, to control the switching periods of a power semiconductor component efficiently, also the current produced by the gate driver is of importance. With the arrangement of EP 2178211 B1, the current to the gate of the controlled component cannot be set to a desired level in all desired periods of controlling the component.

BRIEF DESCRIPTION OF THE INVENTION

An object of the present invention is to provide a gate driver and a method of controlling a gate driver so as to overcome the above problem. The objects of the invention are achieved by a gate driver and a method which are characterized by what is stated in the independent claims. The preferred embodiments of the invention are disclosed in the dependent claims.

The invention is based on the idea of arranging multiple of resistors and switches in the driver circuit for providing different control voltages to the output stage of the gate driver. The resistors together with the switches are connected to the auxiliary voltages of the gate driver such that the switches are controlled to provide a selected control voltage for operating the output switches of the output stage of the driver circuit. The resistances of the resistors are selected is such a manner that a variety of control voltages together with selected current levels are available from the driver circuit. As the resistors and the switches are providing voltages and currents to the output switches of the driver circuit, the resistors and the switches can be of small size and power rating. The currents through the components are in the range of milliamperes and therefore the power losses in the driver circuit are minimal.

The gate driver of the invention is simple and consists of low-cost components and yet the gate driver is able to control the controlled power semiconductor component in separate periods and in effective way. The gate driver of the invention enables to control the switch component such that separate periods of the state change of the switch component are taken into account. With the invention, the current fed to the gate of the controlled semiconductor component and the voltage applied to the gate of the component in different periods can be set. This enables to control the speed of the state change and losses during the state change and during the conduction time. The speed of the switching of the controlled component affects the radiated and conducted interferences and by controlling the losses of the component, the adverse effects of temperature changes can be reduced. Further, the invention can be employed to increase the performance of a device in which the circuit and method are employed, as the switching speed and the gate voltage can be set to highest possible values in each operation point.

As the gate driver enables a precise control of the controlled component, the parallel use of semiconductor components is simpler without the need of carefully selecting the paralleled components before the use.

The method of controlling a gate driver enables to produce selected gate voltages and currents to the gate of the controlled semiconductor component.

According to embodiments of the invention, the gate voltages and currents can be selected during the use of the component based on multiple of factors, such as limiting the temperature variations, limiting the radiated interferences and maximising efficiency.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
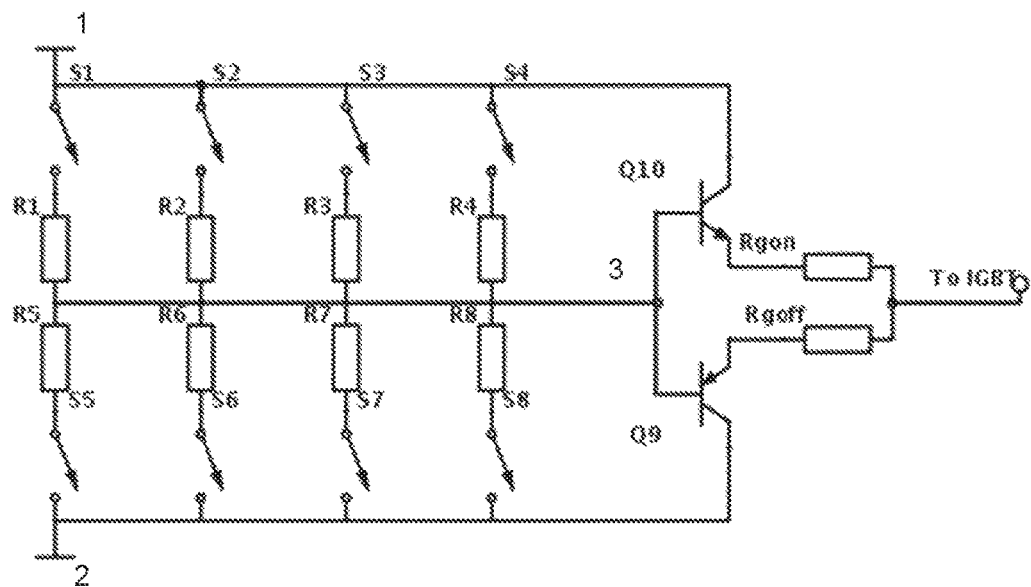
FIG. 1 shows an embodiment of the circuit of the present invention.

FIG. 1 shows an embodiment of the gate driver circuit of the invention. The gate driver of the embodiment comprises an output stage composed of output switch components Q9, Q10. The output switches are connected in a known manner between a high auxiliary voltage rail and a low auxiliary voltage rail. The auxiliary voltages are supplied to the rails for providing a voltage difference between the rails. The voltage of the low auxiliary rail may be a negative voltage or a positive voltage. In the following the high auxiliary voltage rail and the low auxiliary voltage rail are referred to as positive auxiliary rail and negative auxiliary rail.

In the embodiment shown in FIG. 1, the output stage comprises output switches, which are transistors forming a push-pull circuit. In such a circuit, the control electrodes 3 i.e. the bases of the transistors are electrically connected to each other to form the control input of the output stage. In the embodiment of FIG. 1, the output of the output stage is connected to two gate resistor, and the other end of the gate resistors forms the output voltage of the gate driver which can be led to the gate of the controlled semiconductor component for controlling the component.

According to the present invention, the output stage produces the output voltage of the gate driver. In the embodiment of FIG. 1, the circuit comprises two gate resistors Rgon, Rgoff. Gate resistor Rgon provides gate resistance when the upper output switch component Q10 is conducting and gate resistor Rgoff provides gate resistance when the lower switch component Q9 is conducting. Thus separate gate resistors are used for turn-on and turn-off procedures. The two gate resistances can also be substituted with a single gate resistance in a known manner. In such case, the outputs of the switch components are connected directly to each other and this connection point is connected to a gate resistor and the other end of the gate resistors provides the output voltage of the gate driver circuit. FIG. 1 shows thus an embodiment of the invention which employs gate resistors. However, the circuit of the invention does not required gate resistors, as invention enables the output current of the driver circuit to be set to a desired value. In a case when gate resistor is not employed, the outputs of the switch components Q9, Q10 are connected to each other for forming the output terminal of the gate driver.

According to the present invention, the gate driver circuit comprises a plurality of series connections of controllable switches S1 . . . S8 and resistive components R1 . . . R8. A first part of the plurality of series connections is connected between the positive auxiliary voltage rail 1 and control input of the output stage. FIG. 1 shows how four series connections S1, R1; S2, R2; S3, R3; S4, R4 of resistors and controllable switches are connected between positive auxiliary voltage rail 1 and the control input of the output stage. Similarly a second part of the plurality of series connections S5, R5; S6, R6; S7, R7; S8, R8 is connected between the negative auxiliary voltage rail 2 and control input 3 of the output stage. With the voltage rail it is referred to a certain part of the electronic circuit. When in use, voltages are provided to the voltage rails for providing voltage for the circuit.

As shown in FIG. 1, the first part of series connections are connected in parallel. Similarly the second part of the series connections are connected in parallel, and these two parallel connections are further connected in series. The control electrodes of the output switches are connected to the point between the series connections of the parallel connected switches and resistors. In the following, the control input of the output stage is referred to as control electrodes of the output switches, as reference is made to the circuit of FIG. 1.

The driver circuit of FIG. 1 is operated by providing a control voltage to the control electrodes 3 of the output switches. The control voltage is provided by controlling the controllable switches. The controllable switches are controlled such that a desired voltage is obtained to the control electrodes of the output switches. In operation, positive auxiliary voltage is supplied to the positive auxiliary voltage rail, and correspondingly, a negative auxiliary voltage is applied to the negative auxiliary voltage rail. The state of the controllable switches set the potential that is applied to the control electrodes of the output switches when the auxiliary voltages and the values of the resistors are fixed. The positive auxiliary voltage is, for example 18 Volts and the negative auxiliary voltage is, for example, −8 Volts and therefore the output voltage from the gate driver circuit is between these voltage values. The auxiliary voltages are referenced against the emitter potential of the controlled component in a known manner.

When at least one of the controllable switches of the first part of the controllable switches (the upper switches) is conducting and at least one of the controllable switches of the second part of the controllable switches (the lower switches) is conducting, the voltage applied to the control electrodes is defined by the voltage division between the active resistors, i.e. the resistors with which the conducting switches are in series. For example, if only switches S1 and S6 are controlled conductive, then the voltage applied to the control electrodes is defined by the ratio of the resistances R1 and R6 and the voltage difference between the positive and the negative auxiliary voltages. Similarly, when other switch combinations are selected, the voltage of the control electrodes of the output switches is defined by the voltage division of the active resistors. The controllable switches enable to select different combinations of active resistors such that different voltage levels are achievable by selecting differing combinations. The upper active switches connect upper resistors in parallel and the lower active switches connect lower resistors in parallel. The resistance formed with upper and lower active switches define the voltage division, and therefore the control voltage applied to control electrodes of the output switches.

When only one or more of the upper switches are conductive, the voltage of the control electrodes equals to the voltage of the positive auxiliary voltage and correspondingly, if only one or more of the lower switches are conductive, the negative auxiliary voltage is led to the control electrodes.

According to the invention, a control circuit is provided for controlling the controllable switches for providing a control voltage to the control electrodes of the output switches, i.e. to the control input of the output stage. The control circuit of the invention controls the controllable switches. The control circuit is connected to each of the controllable switches for providing control voltages to each of the controllable switches. According to an embodiment, the control is carried out according to a set sequence in which the controllable switches are controlled to produce a certain control voltage sequence to the output switches.

During a turn-on procedure, i.e. when the power semiconductor component is controlled conductive, the procedure may comprise one or more sets of control voltages provided to the controllable switches. In its simplest form, the turn-on can be implemented by providing a single control voltage to the output switches using a single combination of control voltages. Preferably, the turn-on procedure is carried out with a sequence of control voltages produced by controlling the controllable switches. The turn-on procedure may comprise two or more periods in which the control voltage to the control electrodes is changed. Similarly, the turn-off procedure may comprise one or more sets of control voltages produced in timed manner for turning the component in blocking state.

The values of the resistors used in the driver circuit are selected such that during the turn-on and turn-off of the controlled semiconductor component, a desired control procedure can be accomplished. As mentioned above, the resistors are used producing voltage division to the control electrodes. The voltage applied to the control electrodes of the output switches is dependent on the relative values of the upper and lower resistors, i.e. the same voltage division can be achieved with different absolute values of resistors. The used resistance values have an effect on the current fed to the control electrodes of the output switches. This current to the control electrodes is amplified by the output switches. The choice of the absolute values of the resistors has thus an effect on the current fed from the driver circuit to the controlled semiconductor component. With the invention it is possible, for example, to produce same gate voltages to the controlled semiconductor component with different gate currents.

FIG. 1 provides one example of the gate driver circuit of the present invention. In the embodiment eight resistors are shown in the driver circuit. However, the number of the resistors in not restricted to eight, but can be higher or lower depending on the design and need of accuracy of the control procedure.

The controllable switches in series with the resistors are controlled preferably in a bipolar manner in which one upper and lower switch form a controlled pair and in such a pair either the upper or lower switch component is conducting while the other switch of the pair is blocking. The controllable switches can be also controlled completely independently from each other increasing the number of possible states and thereby obtained voltage levels.

In the above, the basic operation of the circuit of the invention is described and in the following the turn-on and turn-off procedures are described in more detailed manner with reference to specific embodiments.

Figure 2:
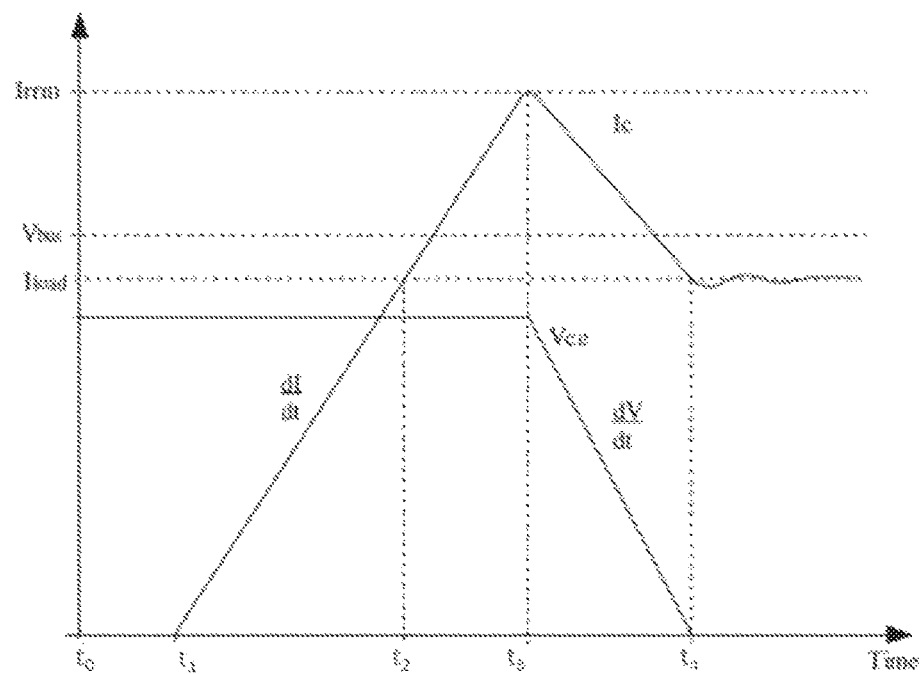
FIG. 2 shows current and voltage waveforms during turn-on of a controlled component.
Figure 3:
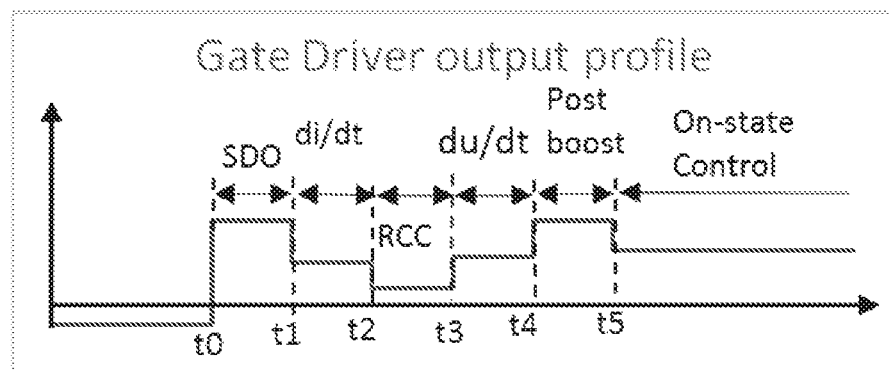
FIG. 3 shows an example of a control voltage sequence during turn-on procedure.

FIG. 2 shows current and voltage waveforms relating to turn-on procedure of an IGBT semiconductor component. More specifically FIG. 2 shows the collector to emitter voltage and collector current of the IGBT during turn-on of the IGBT as a function of time. FIG. 3 shows an example of voltage profile generated with the driver circuit of the invention. The voltage profile of FIG. 3 represents the control voltage applied to the control electrodes of the output switches and the time values in FIG. 3 correspond to that of FIG. 2.

The turn-on procedure is started with a pre-boost period, in which the control voltage is raised to a high value for initiating the turn-on. The purpose of this time period is to minimize the switching delay, and the period is also referred to as switching delay optimizer ("SDO"). During that period the collector current of the controlled component is not yet increased and the time period of the pre-boost can be selected depending on the type of the controlled component.

After the pre-boost period, the switching speed and corresponding switching time is selected. As will be described later, the selection of switching speed has certain advantages. This second time period t1-t2 is denoted as di/dt in the FIGS. 2 and 3. The applied voltage during that period thus affects the speed of the current change. As shown in FIG. 2, the current of the controlled component increases during this period while the collector to emitter voltage is still high.

The next time period is denoted as "RCC" referring to reverse current clamping. As known, a diode reverse recovery current has some adverse effects in half-bridge topologies. When the control voltage is reduced as shown during time period t2-t3, the effects of the reverse recovery current can be minimized.

During the time period t3-t4 denoted as "du/dt" the voltage over the component falls down. The selection of the control voltage during that time period affects the speed of change of the collector to emitter voltage. By setting the value of control voltage and time of that period, the voltage speed change can be selected. It is to be noted, that the invention enables to control the change rate of current (di/dt) and the change rate of voltage (du/dt) independently.

Time period t4-t5 shown in FIG. 3 is denoted as "post boost" period. During this period the control voltage is increased to a high level so as to minimize the losses of the conduction state in the beginning of the conduction state. With the post boost period the controlled semiconductor component recovers thermally from the switching stresses.

After the time instant t5 the control voltage is set to a value of on-state control which is used until the next turn-off.

Thus in an embodiment of the invention, when a turn-on command is received from a modulator or another controller, the control circuit of the gate driver produces the above voltage sequence by controlling the controllable switches S1-S8. In the above embodiment, the turn-on procedure comprises six voltage periods in which the voltage can be selected. However, in the invention the number of the periods in the turn-on procedure is not necessarily six, but can be varied according to design.

An example of turn-off procedure is described with reference to FIGS. 4 and 5. As in turn-on, the sequence is initiated with a pre-boost operation referred to as SDO. In turn-off, the control voltage is reduced to a low value in order to minimize the delay in the switching.

During time period t0-t1, the collector to emitter voltage increases and the control voltage selected in that period affects the voltage change rate du/dt.

Time period t1-t2 is denoted as "VOC" (voltage overshoot clamping) as the voltage level during that period is used to limit the voltage overshoot. The selected voltage level is shown to be positive such that the controlled component is controlled towards conduction. The collector to emitter voltage overshoot is due to the voltage induced in the inductances of the component as the collector current is decreasing.

During the next time period t2-t3 the change rate of current is controlled by selecting a suitable voltage level to the control electrodes of the output switches. As with the turn-on procedure, the current and voltage change rates can be controlled independently using the circuit of the invention.

After the time instant t3 and during time period t3-t4 ("post boost"), the control voltage is set to its final value in which it is kept until the next turn on of the component.

As described above, the circuit of the invention enables to produce different control voltages to the output switches with different values of current. Table 1 shows a table which lists an example of the voltage levels obtained by controlling the controllable switches. In the Table 1 bipolar control of the controllable switches is considered and DRV[1] . . . DRV[4] denote a controlled switch pair. The rows of the table show the states of the control (OFF, 1, 2, 3, 4, 5) and column Vge shows the output voltage from the driver circuit obtained with the different states. In the table, "1" denotes that the upper switch of the switch pair is conducting and the lower is blocking and "0" denotes that the lower switch is conducting and the upper switch is blocking. Column Ist further shows the current through the resistors in the circuit.

TABLE 1

Gate Driver voltage levels

| | DRV[1] | DRV[2] | DRV[3] | DRV[4] | Vge | Ist | |
|---|---|---|---|---|---|---|---|
| OFF | 0 | 0 | 0 | 0 | −13.20 | N/A | OFF |
| 1 | 0 | 1 | 0 | 0 | 11.42 | 0.20 | ON |
| 2 | 0 | 1 | 1 | 0 | 12.78 | 0.24 | ON |
| 3 | 1 | 1 | 0 | 0 | 13.90 | 0.26 | ON |
| 4 | 1 | 1 | 1 | 0 | 14.84 | 0.30 | ON |
| 5 | 1 | 1 | 1 | 1 | 17.27 | 3.37 | ON |

The values of the resistance with which the voltage levels of FIG. 1 were obtained are R1=510Ω, R2=150Ω, R3=820Ω, R4=10Ω, R5=2000Ω, R6=10Ω, R7=4700Ω and R8=10000Ω. The resistors are placed as shown in FIG. 1.

Above a specific embodiment with different periods during switching was described. However, the procedure does not have to have all the described periods. In an embodiment of the invention, when a turn-on command is received, the control voltage to the output switch component is changed according to a predefined procedure. For example, the output voltage is first controlled to a higher value, then to a value somewhat lower, then again to a higher value and finally to value which is selected to keep the controllable switch in the conducting state. Thus the controller of invention selects a control pattern for each of the controllable switches such that the desired output voltage sequence is obtained.

During the turn-off procedure, similar operation is carried out. That is, when the state of the controlled semiconductor component is changed from conductive to blocking state, the driver circuit produces a voltage sequence using the resistors and controllable switches. The turn-off sequence may be, for example such that the control voltage of the output switches is changed from conduction state control first to a lower value and then to a value that shuts the controlled semiconductor component completely and holds the component in the blocking state. Referring to FIGS. 3 and 5 for turn-on and turn-off, the turn-on procedure may comprise only periods "SDO", "control" and "post boost". Similarly, the turn-off procedure may comprise only periods "SDO", "control" and "post boost". With such procedures the "control" period includes in the turn-on procedure periods "di/dt", "RCC" and "du/dt" shown in FIG. 3, and correspondingly periods "du/dt", "VOC" and "di/dt" in the turn-off procedure as shown in FIG. 5.

Figure 4:
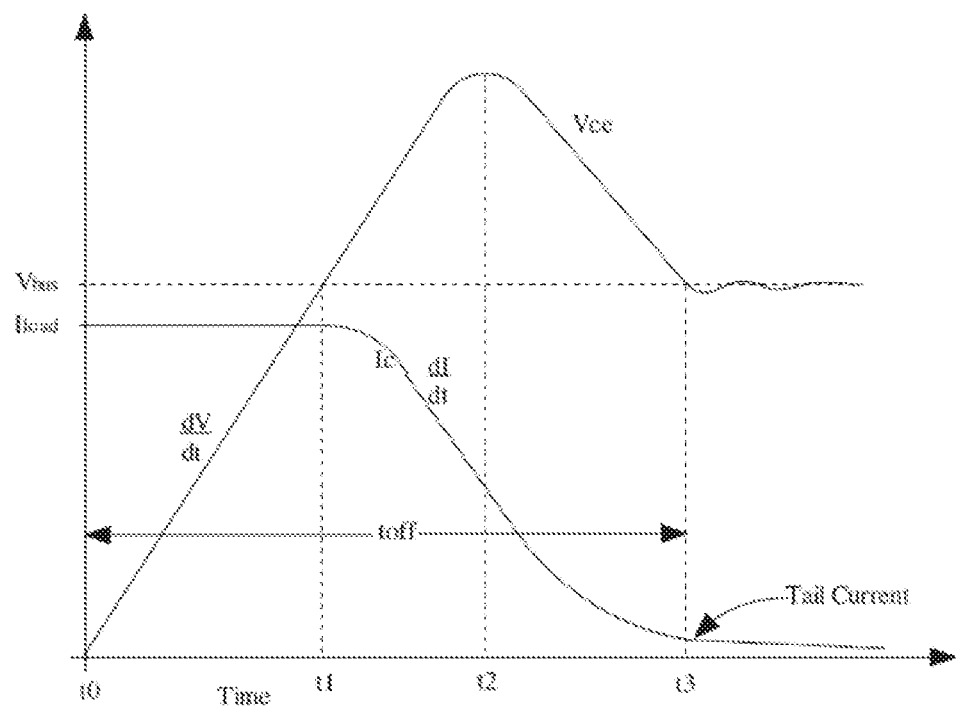
FIG. 4 shows current and voltage waveforms during turn-off of a controlled component.
Figure 5:
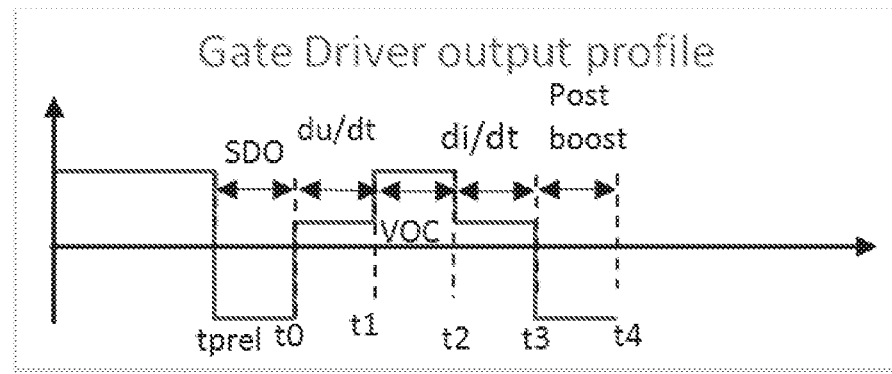
FIG. 5 shows an example of a control voltage sequence during turn-off procedure.

FIGS. 2 and 4 show various voltage and current limits, such as Vbus, Iload, Irrm. It is shown in FIG. 2 how at time instant t2 current of the component Ic exceeds the value of the load current Iload, i.e. the collector current overshoots over the steady-state current value. Further, it shown that at time instant t3 the current reaches its maximum value Irrm, i.e. the maximum of reverse recovery current. Voltage Vbus refers to intermediate circuit voltage of an voltage source inverter.

According to an embodiment, both in turn-off and turn-on, each of the periods of the voltage sequences has a pre-determined length, which is programmed to the controller of the gate driver circuit. In such an embodiment, the procedures are read from a memory associated with the controller of the gate driver. When a turn-on or turn-off command is received, the programmed and stored procedure is carried out.

According to an embodiment, the produced voltage levels applied to the control electrodes of the output switches are selected during the use of the driver circuit. The selection of active switch combination and thus the voltage level may be carried out actively to influence certain properties of the device or the controlled semiconductor component. Specifically, the selection of the control voltage may be carried out based on limiting the temperature variations, limiting the radiated and conducted electromagnetic interferences, maximizing the efficiency of the device or the lifetime of the device, for example.

It is known that the conduction state losses of a voltage controlled semiconductor component depend on the gate voltage and temperature. The on-state losses can be controlled to compensate the temperature changes of the component. If, for example the junction temperature of the controlled component is high, a high gate voltage can be selected such that on-state losses are reduced. Further, if the junction temperature of the controlled component is low, a lower gate voltage can be selected to increase the temperature of the component.

It is also known that radiated disturbances are dependent partly on the switching speed of the semiconductor component. The switching speed is on the other hand dependent on the temperature of the component and on the collector current of the component. When the junction temperature or the collector current of the component increases, the switching time of the component increases also. The switching speed can be affected with the circuit and method of the invention by employing a suitable control voltage to the output switches. With a suitable selection of the control voltage the effects of temperature to the switching speed can be eliminated. For example, when the junction temperature of the IGBT is low, the change rate can be decreased and when the junction temperature is high, the switching speed can be increased.

The selection of gate current defines the time required to charge the gate for an IGBT to turn-on. For example, when the junction temperature of the controlled component or the temperature of the coolant of the component is low, a small gate current can be selected to increase the losses, i.e. to slow down the switching speed. Correspondingly, when the temperatures are high, a higher gate current can be selected to reduce the losses due to faster switching.

Figure 7:
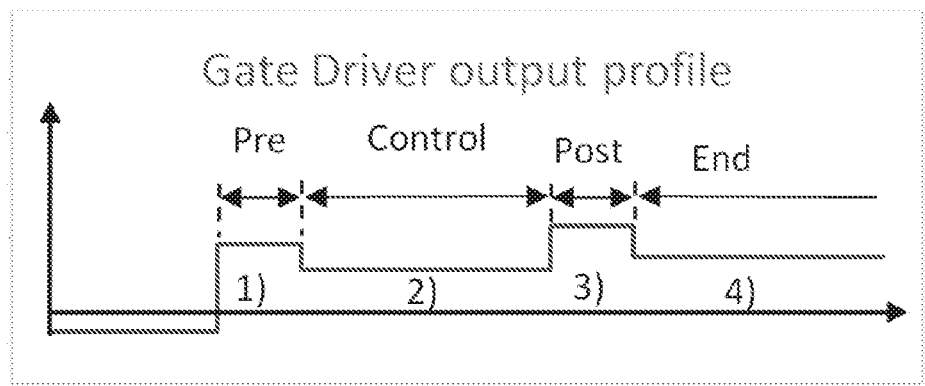
FIG. 7 shows an example of a control voltage sequence according to selection procedure of FIG. 6.
Figure 6:
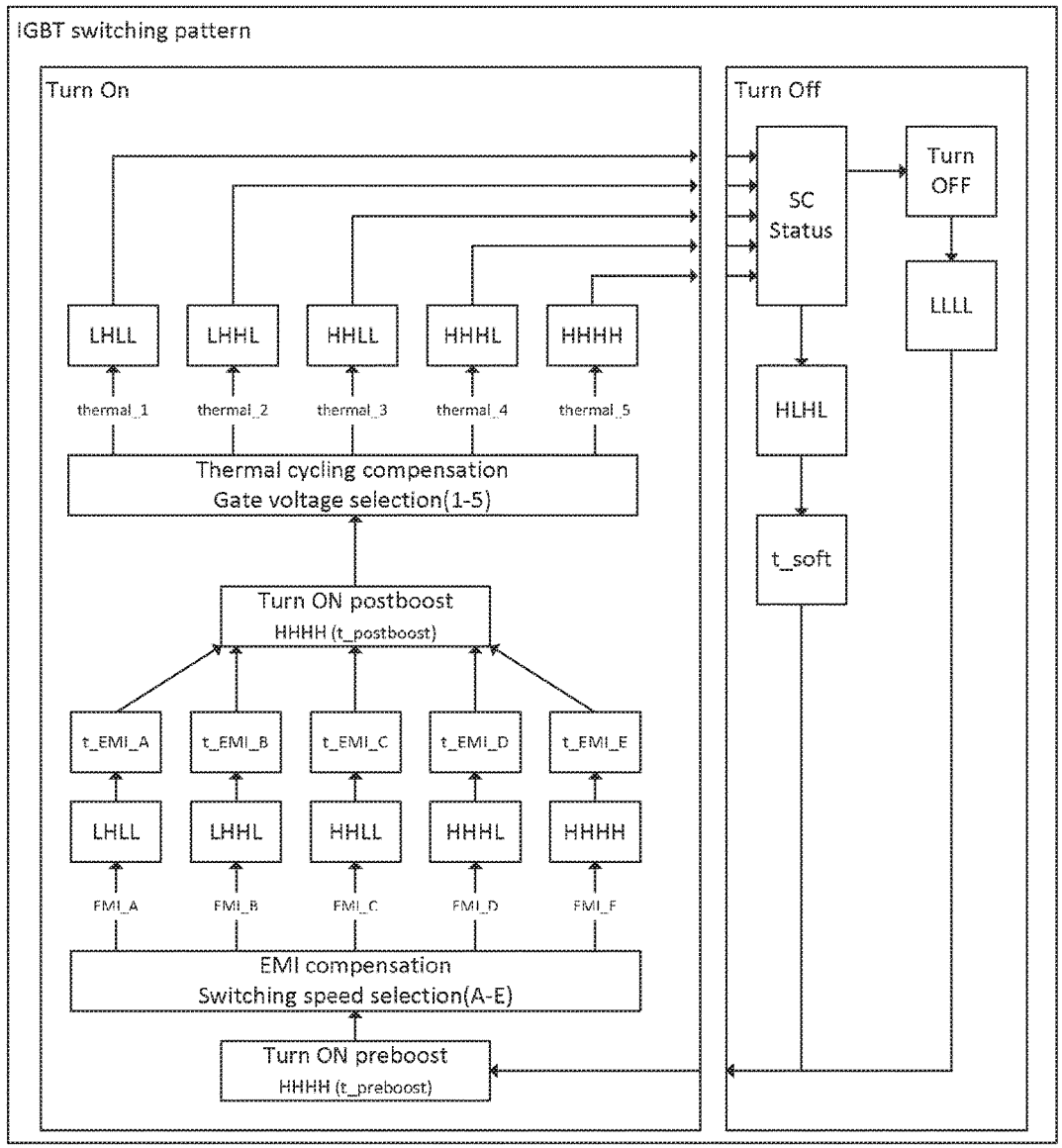
FIG. 6 shows a switching sequence selection procedure.

FIG. 6 shows an example of a procedure for selecting the switching sequence in a gate driver circuit of the present invention for compensating switching related EMI and temperature cycling. As known, temperature cycling refers to variation of temperature which stresses mechanically the switch components. FIG. 7 shows a switching sequence obtained with the procedure of FIG. 6 during turn on.

Considering that the controlled component is initially turned off, the procedure begins with turn on command from the modulator or other component commanding the state change. First a pre boost voltage is applied. FIG. 6 also shows examples of states of the controllable switch components. In connection with turn on pre boost state HHHH is selected. The sates are presented with high and low symbols "H" and "L" and considering bipolar switching of the controllable switches. Thus the state HHHH indicates that all the upper switches are conducting. The pre boost is applied for a time period of t_preboost and the time period can be selected freely depending on the type of the controlled semiconductor component. This period is shown in FIG. 7 as "Pre".

After the time period for the pre boost has elapsed, a switching speed selection is made for EMI compensation or its temperature dependency. Thus if the junction temperature of the controlled semiconductor switch is high, the switch turns on more slowly than a cooler component. Therefore, for a higher temperature a higher switching speed can be selected with a higher gate voltage. On the other hand, if the component is cooler, then a lower gate voltage is selected.

FIG. 6 shows 5 parallel switch combinations out of which one is selected based on the temperature of the component, for example. The parallel paths in FIG. 6 are marked with EMI_A . . . EMI_E. Together with the switch combination the active time of the use of the combination is selected. Thus if the junction temperature of the component is considerably low, switch combination LHLL is selected and it is kept active for a time period of t_EMI_A. Depending on the temperature other switch combinations and respective on-times are selected. The EMI compensation period is shown in FIG. 7 marked as "Control".

After the selected time period is elapsed, Turn ON post boost is then commanded. In the post boost highest possible voltage HHHH is selected as the control voltage and it is kept active for a time period of T_postboost. The post boost period is shown in FIG. 7 as "Post".

After the post boost, the component is conducting, and the gate voltage for the on-state is selected based on the thermal cycling compensation. Again, the example of FIG. 6 shows 5 possible alternatives for the gate voltage marked as thermal_1 . . . thermal_2. The used gate voltage is selected based on thermal considerations and specifically for keeping the temperature variations minimal. If it is considered that more losses are required, a smaller gate voltage is selected (LHLL). On the other hand, if the temperature should not be increased, the gate voltage is selected to be high (HHHH). In FIG. 7, the on state control voltage is shown as period "End".

The selected switch combination and thus the gate voltage is held until the turn-off command is received.

FIG. 6 also shows the turn-off process. In the embodiment, only two alternative paths are shown. When turn-off is initiated, block "SC Status" checks if short circuit current is flowing through the component. If not, the process continues to block "Turn OFF" which commands the controllable switches to state "LLLL", i.e. the controllable switches are controlled to a position forming a full negative voltage to the gate of the controlled component.

If a short circuit has been detected, then a soft turn-off is initiated by using switch combination HLHL for a period of time t_soft. After the period is ended, full negative control voltage LLLL is applied to the output switches, and the component is controlled to a blocking state.

With the circuit of the invention, the temperature cycling can be minimized by selecting switch combinations that minimize the highest junction temperature and maximize the lower junction temperature of the controlled semiconductor component. Further, the so called power cycling can be minimized by limiting the abrupt temperature changes.

When, for example the junction temperature is increasing, the losses are temporarily decreased with a switch combination leading to fast switching speed and/or to high gate voltage. When, on the other hand, the junction temperature is decreasing, the losses are increased with a slow switching speed and/or low gate voltage.

The temperature and power cycling can be minimized using different compensation methods. The compensation can be based on temperature, such as junction temperature, coolant temperature or case temperature of the controlled semiconductor component. Further, the compensation can be carried out on the basis of the collector current or of the power losses of the controlled component. Further, when the method and circuit of the invention is employed in a three-phase inverter, the compensation can be based on the effective value of the output current vector. Any of the applied compensation methods can be based on measurements, calculations or estimations or combinations of these.

In the invention, it is possible to define certain states of the controllable switches which are allowed and not allowed for obtaining a certain effect. For example, when temperature cycling is compensated, it should not be allowed to use low switching speeds with high output currents when the coolant temperature is also high. Further, when the coolant temperature is low, the high switching speed should not be used. These allowable states or allowable combinations of controllable switches can be stored as a function of output current and temperature of the coolant. When allowed states are stored, these states can be further to implement compensation of another property, such as power cycling or EMI.

As another example, the temperature cycling compensation can be implemented using a suitable on-state gate control. Such stored allowed switch combinations can be stored as a function of temperature of the coolant and as a function of output current. To compensate thermal cycling, when the output current is high and the temperature of the coolant is high, it is not allowed to use a switch combination leading to gate voltage with a low value as the temperature may by still increased.

Compensation of the power cycling can be carried out using gate voltage and allowable switch combinations can be stored as a function of coolant temperature, output current and derivative of the junction temperature.

The invention enables to produce different operation modes according to specific applications in which the power semiconductor is employed. If the device in which the driver circuit of the invention is used is an inverter, possible operation modes include standard mode, EMC mode, long lifetime mode and high efficiency mode, for example. The standard mode is a compromise between the EMC efficiency and the long lifetime mode, in which normal EMC requirements are taken into account. EMC mode uses EMC requirements as the highest priority and the lifetime expectations are fulfilled at the costs of performance.

In a long lifetime mode the highest priority is to ensure the operation lifetime of the controlled component by minimizing the temperature and power cycling. The long lifetime is ensured at the costs of EMC requirements and efficiency. In the high efficiency mode the power losses are minimized in each operation point of the device. When the high efficiency is obtained, the EMC requirements and lifetime are not necessarily taken into account in selecting the switch combination.

The gate driver circuit of the invention is adapted to control a single semiconductor switch component. When multiple of semiconductor switches are employed in a device, multiple gate driver circuits are also employed. The gate driver circuits operate independently from other gate driver circuits. With the gate driver circuit of the invention switching instants can be controlled in such a way that a balanced parallel or series operation of switches is accomplished. The circuit and the method of the invention enable to control the switching such that the parallel operation is fluent and the currents are shared between the components evenly as delays and switching speed can be controlled.

Further, the losses of the component can be manipulated in various ways. For example, the switching losses can be reduced if the conduction state losses have increased due to aging of the component to keep the temperature of the switch component in tolerable range.

In certain inverter topologies there are multiple commutation paths with different inductances in the commutation path. The logic included in the driver circuit may include different turn-on profiles for different commutation paths. With different turn-on profiles depending on the commutation path the induced voltages to the components can be taken into account. Further, in some inverter topologies, such as ANPC three level inverters, certain controlled switch components are kept in conducting state for a long period. The on-state gate voltage can be kept high to minimize losses, and when commutation instant is close, the gate voltage can be somewhat reduced to decrease the change rate of the current in the commutation. The commutation speed can be increased or decreased also in other situations by changing the on-state gate voltage.

The controllable switches employed in series with resistors are preferably FET switches.

If, for example, the losses and speed of the semiconductor device are manipulated, the information should be distributed to all functions that are related to the phenomena. For example, if the system has a thermal model calculating various temperatures or power losses, the thermal model should be notified or updated if the controlled component is switched with a higher or lower switching speed. These switching speed changes as well as other changes affecting the temperatures should be taken into account in the thermal model to ensure the correctness of the values obtained from the model.

In the above, the invention is described with reference to certain embodiments. For example, the specification and the drawings concentrate to an embodiment, in which the output stage of the driver circuit is formed of a push-pull transistor circuit. However, the presented output stage is an embodiment of the invention, and any output stage providing current amplification can be used in the invention. Similarly, the drawings show only an embodiment with two gate resistors. However, the gate resistors are not required in any of the embodiments of the invention. Further, the invention is specifically described in connection with positive and negative auxiliary voltages. However, as mentioned above, the voltage levels does not have to be positive and negative in the invention.

It will be obvious to a person skilled in the art that, as the technology advances, the inventive concept can be implemented in various ways. The invention and its embodiments are not limited to the examples described above but may vary within the scope of the claims.

The invention claimed is:

1. A gate driver circuit comprising a high auxiliary voltage rail and a low auxiliary voltage rail for receiving high auxiliary voltage and low auxiliary voltage,
   output stage connected to the auxiliary voltage rails and comprising a control input and an output terminal for providing an output voltage of the gate driver,
   plurality of series connections of controllable switches and resistive components, wherein
   a first part of the plurality of series connections is connected between the high auxiliary voltage rail and control input of the output stage, and
   a second part of the plurality of series connections is connected between the low auxiliary voltage rail and control input of the output stage, and
   a control circuit for controlling the controllable switches for providing a control voltage and a control current to the control input of the output stage,
   wherein the output stage comprises output switches which are connected to the auxiliary voltage rails and comprise control electrodes and output terminals, the control electrodes being connected electrically to each other for providing the control input of the output stage and the output terminals being connected electrically to each other for providing the output terminal of the output stage.

2. A gate driver circuit according to claim 1, wherein the output stage comprises output switches for forming a current amplifying stage, such as a push-pull circuit.

3. A gate driver circuit according to claim 1, wherein the first part of the plurality of series connections is connected in series with the second part of the plurality of series connections, and the resistive components in the first part and in the second part of series connections form a voltage division for the voltage difference between the high and low auxiliary rails.

4. A gate driver circuit according to claim 3, wherein the voltage division between the high and the low auxiliary voltage rails is provided to the control input of the output stage.

5. A gate driver circuit according to claim 1, wherein the control circuit is adapted to control each of the controllable switches for providing a voltage to the control input of the output stage.

6. A gate driver circuit according to claim 1, wherein the control circuit is adapted to provide a sequence of control voltages to each of the controllable switches for providing a voltage sequence to the control input of the output stage.

7. A gate driver circuit according to claim 1, wherein a memory is associated with the control circuit of the gate driver circuit, the memory storing a sequence of control voltages to be provided to each of the controllable switches.

8. A gate driver circuit according to claim 1, wherein the control circuit is adapted to select the control voltages for each of the controllable switches based on a temperature value or a current value to limit and slow down the change of temperature.

9. A gate driver circuit according to claim 1, wherein the control circuit is adapted to select the control voltages for each of the controllable switches based on a temperature value to limit produced electromagnetic interferences.

10. A gate driver circuit according to claim 2, wherein the control circuit is adapted to select the control voltages for each of the controllable switches based on a temperature value or a current value to limit and slow down the change of temperature.

11. A gate driver circuit according to claim 1, wherein the control circuit is adapted to receive a gate control signal from a modulator or similar controller, and upon receipt of the gate control signal, the control circuit is adapted to select the control voltages for each of the controllable switches.

12. A gate driver circuit according to claim 1, wherein the output terminal of the output stage is connected to at least one resistor.

13. A gate driver circuit according to claim 2, wherein the first part of the plurality of series connections is connected in series with the second part of the plurality of series connections, and the resistive components in the first part and in the second part of series connections form a voltage division for the voltage difference between the high and low auxiliary rails.

14. A gate driver circuit according to claim 2, wherein the control circuit is adapted to control each of the controllable switches for providing a voltage to the control input of the output stage.

15. A gate driver circuit according to claim 2, wherein the control circuit is adapted to provide a sequence of control voltages to each of the controllable switches for providing a voltage sequence to the control input of the output stage.

16. A method of operating a gate driver circuit, comprising:
providing the circuit comprising a high auxiliary voltage rail and a low auxiliary voltage rail for receiving high auxiliary voltage and low auxiliary voltage,
output stage connected to the auxiliary voltage rails and comprising a control input and an output terminal for providing an output voltage of the gate driver,
plurality of series connections of controllable switches and resistive components, wherein
a first part of the plurality of series connections is connected between the positive auxiliary voltage rail and control input of the output stage, and
a second part of the plurality of series connections is connected between the negative auxiliary voltage rail and control input of the output stage, and
a control circuit for controlling the controllable switches, and
controlling the control circuit to provide control voltages to the controllable switches for producing a voltage and a current to the control input of the output stage,
wherein the output stage comprises output switches which are connected to the auxiliary voltage rails and comprise control electrodes and output terminals, the control electrodes being connected electrically to each other for providing the control input of the output stage and the output terminals being connected electrically to each other for providing the output terminal of the output stage.

17. The method of operating a gate driver circuit according to claim 16, wherein the step of providing control voltages comprises providing for the controllable switches a sequence of control voltages.

* * * * *